United States Patent [19]
Vaillancourt et al.

[11] Patent Number: 5,185,720
[45] Date of Patent: Feb. 9, 1993

[54] MEMORY MODULE FOR USE IN A LARGE RECONFIGURABLE MEMORY

[75] Inventors: Steven Vaillancourt, Carson; Cameron B. Wade, Lakewood, both of Calif.

[73] Assignee: TRW Inc., Redondo Beach, Calif.

[21] Appl. No.: 623,829

[22] Filed: Dec. 7, 1990

[51] Int. Cl.⁵ .............................................. G11C 7/00
[52] U.S. Cl. .......................... 365/189.02; 365/189.07; 365/201; 365/238.5
[58] Field of Search ................. 365/238.5, 201, 230.02, 365/189.02, 200, 189.07; 371/11.1

[56] References Cited
U.S. PATENT DOCUMENTS 4,811,296 3/1989 Grade ............................ 365/189.02
4,933,910 6/1990 Olson et al. ..................... 365/238.5

Primary Examiner—Joseph A. Popek
Attorney, Agent, or Firm—Noel F. Heal; Ronald L. Taylor

[57] ABSTRACT

An improved memory module structure for use in a large memory in which, before operational use, the memory modules are tested and configured by a process that requires storing logical page addresses into a page register in each module. In this module, page address data are input to the page register from a data input line to the module. Since there is a separate data input line for each module in a column of such modules, and since the data input lines are not used to carry data to the memory in a test and configuration mode, the data input lines can be used to supply page address data simultaneously to the page registers of an entire column of modules. This avoids having to address each module in the column individually, and reduces testing an configuration time by a factor equal to the number of modules in a column. The complexity of each module is also reduced by obviating the need for individual module addressing in the test mode.

4 Claims, 3 Drawing Sheets

MEMORY MODULE FOR USE IN A LARGE RECONFIGURABLE MEMORY

BACKGROUND OF THE INVENTION

This invention relates generally to large reconfigurable semiconductor memory structures and, more particularly, to the structure of a memory module or macrocell used in a large reconfigurable memory. A semiconductor integrated-circuit memory takes the form of a two-dimensional array of memory cells fabricated together on a single semiconductor chip. Each memory cell typically stores one binary digit or bit of information, and the array is usually designed to store multiple "words" of information, each word having the same number of bits. A common data word length is eight bits, which is referred to as a "byte." For convenience in handling binary cell addresses, the number of words in a memory array is usually a power of two, such as 1,024, 2,048, 4,096, and so forth. Each 1,024 words or bytes of memory is often referred to as "1k" of memory. For example, a 2k memory contains 2,048 words, bytes or bits of memory.

As the area of a semiconductor chip increases, so does the probability that there will be manufacturing defects within the chip. The production "yield" is the percentage of defect-free chips obtained in a production run. The probability of occurrence of manufacturing defects in a unit surface chip area is approximately constant for a particular fabrication process. Therefore, larger chips will have more defects and a lower yield of defect-free circuits. Although the area of a specific circuit can be decreased by further reducing the scale of integration, i.e. by reducing the size of the circuit features and their spacing, this will ultimately result in an increase in the number of defects and a reduction in the production yield.

An alternative to reducing the size of a circuit is to increase the effective production yield by rendering the resulting circuits more tolerant to defects, so that defective circuits can be repaired rather than discarded. Basically, this approach involves designing the circuit to include redundant or spare components, which can be connected into the circuit to replace components that have become defective. U.S. Pat. No. 4,800,302 to Marum, entitled "Redundancy System with Distributed Mapping," discloses a technique for mapping multiple subsystems, some of which may be defective.

Another source of defects is radiation damage. This is highly significant for applications of circuitry to be used in space, where memory cells are subject to damage by cosmic radiation. If only a single memory cell were to be damaged, the defect could be overcome by the use of an appropriate error detection and correction technique. A single-bit error in a relatively large data word can be detected and corrected in this way without the need for reconfiguring the circuitry. However, there is a high probability that a cosmic radiation "strike" on a memory cell would disable not just one cell, but several physically adjacent cells as well. If these damaged cells were all in the same data word, recovery by error detection and correction methods would not be possible. Accordingly, the ideal technique for configuring a memory circuit should be one that minimizes the effects of radiation damage.

Without some technique for increasing the production yield of semiconductor memory arrays, the size of such arrays is effectively limited and may not be easily increased to encompass an entire semiconductor wafer. U.S. Pat. No. 4,653,050 to Vaillancourt proposes a solution to this problem, whereby a large memory array comprises a number of memory modules, each of $1 \times N$ bits in size. The memory array is treated as having P logical "pages," each with N multibit words. Each module provides one bit of memory at the same bit position in every word in a logical page of memory. A damaged module therefore affects only one bit in each word, and the missing bit can be reconstructed using conventional error detection and correction techniques. A memory mapping module provides transformation from logical memory addresses to physical addresses within the modules. Although this approach is satisfactory in many applications, it has the disadvantage that a single, relatively complex memory mapping unit is responsible for mapping memory locations for the entire memory array.

An ideal wafer-scale memory array has the ability to distribute each bit of a stored data word to a different memory module. However, for a 32-bit data word, for example, this would appear to require that a 32-bit data bus be connected to each of the memory modules in the array. This routing of the data bus over a large area of the circuit would render the array more vulnerable to defects, whether resulting from manufacture or from radiation damage. Moreover, each data bus line would need to carry a capacitive load proportional to the total number of memory modules. For these reasons, any scheme for minimizing damage to the memory array should also minimize the extent to which the data bus has to be routed throughout the array. One approach to solving these problems was described and claimed in a Patent application Ser. No. 07/498,882 filed on Mar. 26, 1990 in the name of Cameron Wade now U.S. Pat. No. 5,103,424. Since each memory module is a basic "building block" of large memories of this type, it is important that the modules be structured in a manner that minimizes module complexity and the testing and configuration time. The present invention is directed to this end.

SUMMARY OF THE INVENTION

The present invention resides in an improved memory module or macrocell for use in a large reconfigurable memory, and to a method of using memory modules in such a large memory. Briefly, the invention may be defined as comprising a random access memory (RAM) having an enable terminal, RAM address terminals, a data input terminal and a data output terminal; a two-to-one multiplexer having first and second inputs, the first input being connected to the data output terminal of the RAM, and having an output connected to supply output data from the memory module; a page address register enabled only in a test mode to receive serial page address data over a data input line to the memory module and to simultaneously output serial data over an output line to the second input of the multiplexer; and a page address comparator used only in an operational mode to compare a page address stored in the page address register and a page address supplied over page address lines to the memory module, and to generate an enable signal to the RAM upon detection of a match.

In the test mode, page address data are shifted into the page address register from the data input line and simultaneously shifted out of the page address register, through the multiplexer and onto the data output line. In the operational mode, the RAM is enabled when the page address supplied on the address lines is the same as the page address stored in the page address register, and data may be written to the RAM from the data input line or read from the RAM onto the data output line.

The invention may also be defined in terms of a large reconfigurable memory comprising a plurality of memory modules grouped into columns of modules, with each column having the same number of modules; address bus means, for connecting to each module a logical address comprised of a page address and a random access memory (RAM) address; and data bus means, for connecting data to each bus, such that each module in a column has its own data input and output lines; and wherein each memory module includes the elements recited in the preceding paragraph, namely a RAM, a multiplexer, a page address register, and a page address comparator.

In terms of a method, the invention comprises the steps of applying a test mode signal to a column of memory modules when it is desired to load page address data into a page register in each module; transmitting serial page address data through a data input line associated with a first of the modules; shifting the page address data into a page register in the first module, and simultaneously shifting the previous contents of the page register out onto a data output line associated with the module; and simultaneously transmitting serial page address data through data input lines associated with the other memory modules in the column, and shifting the page address data into the page registers of the other modules, while the previous contents of those page registers are shifted out onto the data output lines associated with the other memory modules. In this manner, an entire column of memory modules can be tested and configured simultaneously.

It will be appreciated from the foregoing that the present invention represents a significant advance in the field of large reconfigurable memories. In particular, groups of memory modules can be tested and reconfigured in parallel, without addressing each module individually. The invention effects a large reduction in the time needed to test and configure a memory, as well as a reduction in the complexity of each memory module. Other aspects and advantages of the invention will become apparent from the following more detailed description, taken in conjunction with the accompanying drawings.

DESCRIPTION OF THE PREFERRED EMBODIMENT

Figure 1:
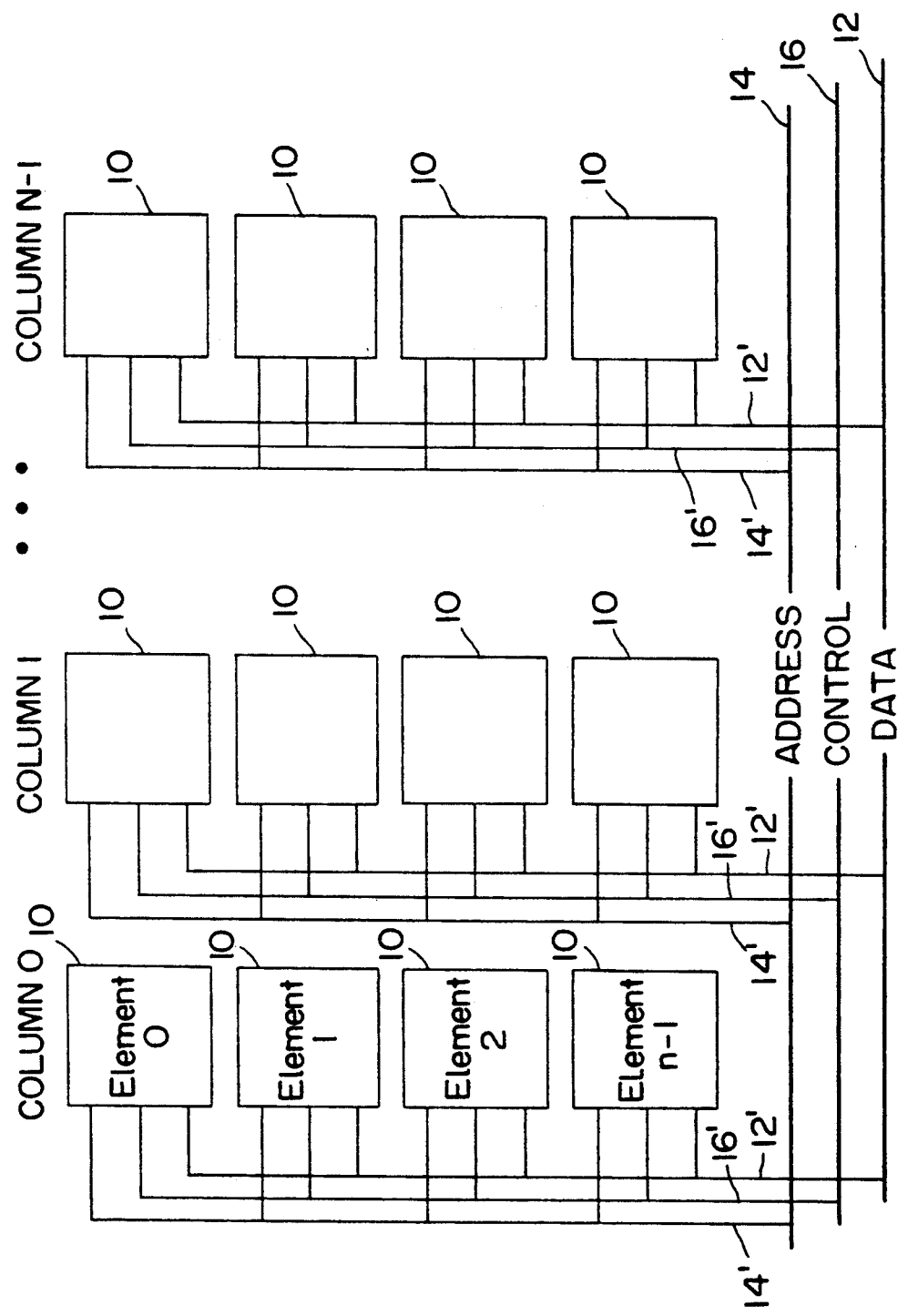
FIG. 1 is a block diagram showing a memory structure comprising multiple memory modules or macrocells.

As shown in the drawings by way of illustration, the present invention is concerned with large reconfigurable memories having multiple memory modules that are addressed by a logical addressing scheme. In the event of a defect in one or more memory modules, replacements may be made from a pool of spare modules. The present invention is concerned with an improvement in the structure of the memory modules, but the overall memory architecture will first be described.

Each memory module, or macrocell, is logically organized to have $1 \times m$ bits, where m is typically 2,048 or some other convenient number. The modules may be thought of as arranged in an array of rows and columns. A convenient data word size for a large memory is chosen, for example 22 bits, which include codes used for error detection and correction. Thus an array of 22 modules could be used to provide storage for 2,048 22-bit words, but would have no spare modules at all.

FIG. 1 shows an conventional arrangement of multiple memory modules, indicated by reference numeral 10. The modules are arrayed in N columns, with n modules in each column. A global data bus 12, address bus 14 and control bus 16 extend perpendicularly to the columns, and column buses 12', 14' and 16' extend from the global buses along each of the columns, to make connections with the memory modules 10.

In one memory system to be described by way of example, there are 576 modules, indicated by reference numeral 10, arranged in thirty-six columns of sixteen modules each, i.e. $N=36$ and $n=16$. The 22-bit data words in the memory structure are addressed by a 16-bit data address, divided into an 11-bit RAM address or word address and a 5-bit page address. The RAM address determines which bit of each 2,048-bit module is accessed for reading or writing data. One may consider the modules to be arrayed in three-dimensional space, with the columns and rows of macrocells extending in two dimensions and the 2,048 memory elements of each module extending orthogonally in a third dimension. The 11-bit RAM address then determines the position of a "slice" through this three-dimensional memory structure. The page address identifies twenty-two specific modules within the array. These modules are used to store a data word specified by the page/RAM address, at the "slice" position specified by the RAM address. Finally, the bit assignments (0-21) in the data word must also be specified, so that each of the twenty-two modules making up a page is assigned to a unique bit position within each data word.

Configuration of the memory involves assigning each active memory module a unique combination of page number and bit position. Once these assignments are made, a memory write or read operation to or from a location specified by page and RAM address uses the page address to select an appropriate group of macrocells, uses the bit assignments to apply the individual data bits to their proper modules within the group, and uses the RAM or word address to select the appropriate bit slice in the modules.

The foregoing description tacitly assumes that each bit of a data word may be assigned to any macrocell in the array. For this to be true would require that data lines be bused to every module in the array, as shown in FIG. 1. While this is desirable from the standpoint of having complete freedom to assign data bits to any desired modules, it is impractical from a design standpoint to run a data bus to every module in the architecture. A data bus this extensive would be subject to additional defects during fabrication and during operation. Accordingly, other busing arrangements are needed, but are not the subject of the present invention.

Figure 2:
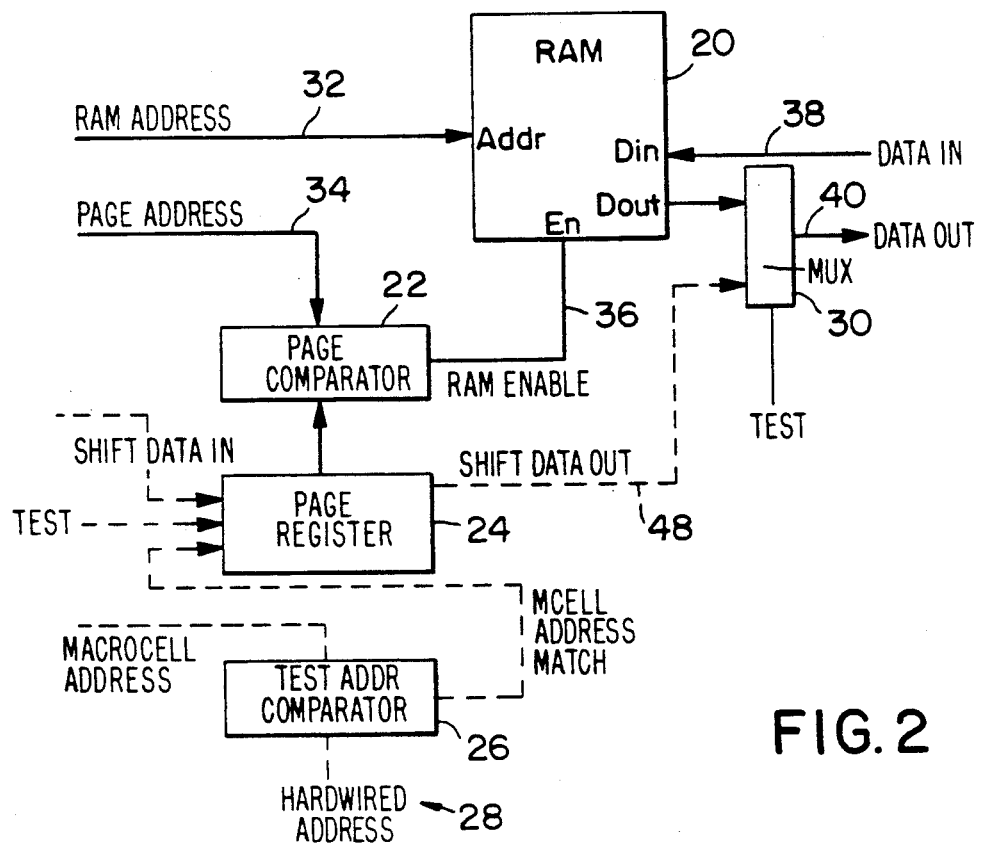
FIG. 2 is a block diagram of a memory module, shown connected in its operational mode.
Figure 3:
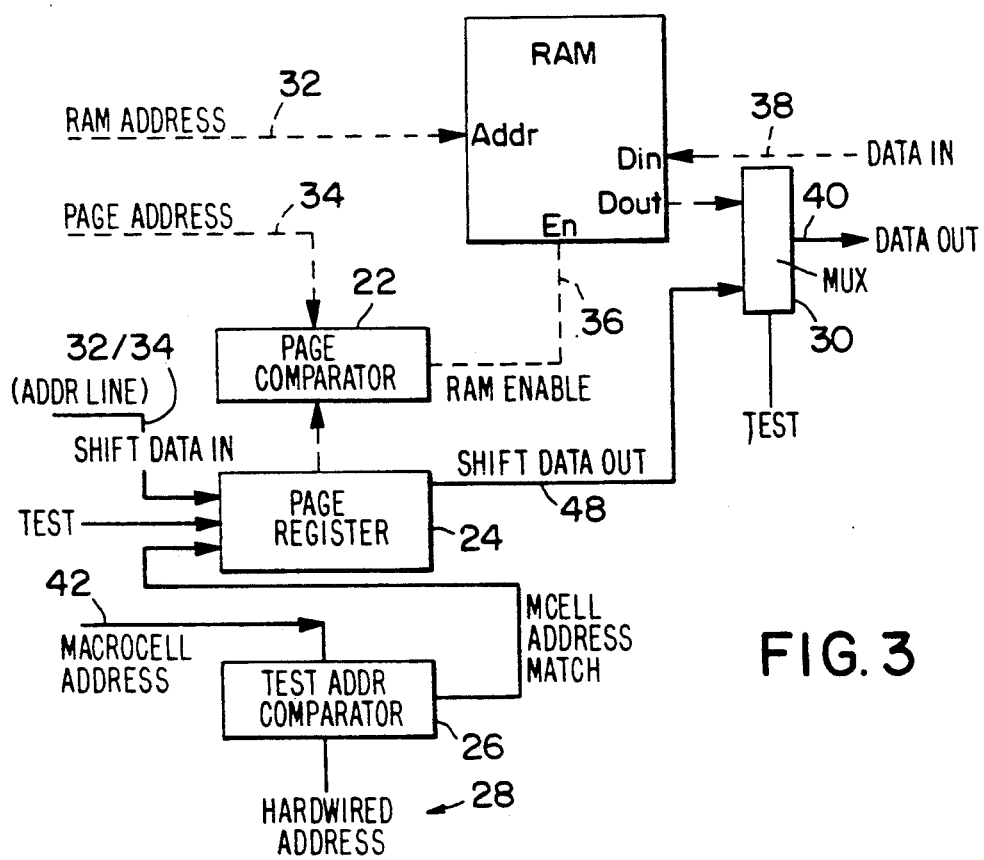
FIG. 3 is a block diagram similar to FIG. 2, but with memory module shown connected in its test and configuration mode.

One possible construction of a memory module is shown in simplified form in FIGS. 2 and 3. Basically, the module includes a random access memory (RAM) 20, a page comparator 22, a page register 24, a test address comparator 26, a hard-wired address 28 and a multiplexer 30. In its operational mode, shown in FIG. 2, the module contains a page address in its page register 24. Addressing of the module is by a logical address comprising a page address and a word address, or RAM address, within the logical page. The RAM address is applied to the RAM 20 over address lines 32, and the page address is applied to the page comparator 22 over lines 34. If the page comparator 24 determines that the page address on lines 34 is the same as the page address previously stored in the page register 24, the comparator generates a signal on line 36, which enables operation of the RAM 20. For a write operation, input data signals on line 38 are applied to a data input terminal of the RAM 20. For a read operation, output data signals from the RAM 20 is applied to the MUX 30 and output from the MUX on output data lines 40.

FIG. 3 illustrates operation of the module in the configuration and test mode. Each module has a unique hard-wired address 28, and this is compared, in the test address comparator 26, with the module address on lines 42. If a match is found, an enabling signal is generated on line 44 to the page register 24. A test mode signal on line 46 is also required to enable the page register 24. On of the address lines 32, 34, which are not used for memory addressing in this mode, is used to supply data serial form to the page register 24. Basically, in the test mode each memory module is addressed by signals on the module address lines 42, and a page address for the module is input serially over the address line borrowed for this purpose. Simultaneously, the previous contents of the page register are shifted out over line 48 to the multiplexer 30, which, in the test mode, selects this output instead of data from the RAM 20. Thus, in the test mode a page address is written into the page register 24 and the previously stored page address is retrieved.

Figure 4:
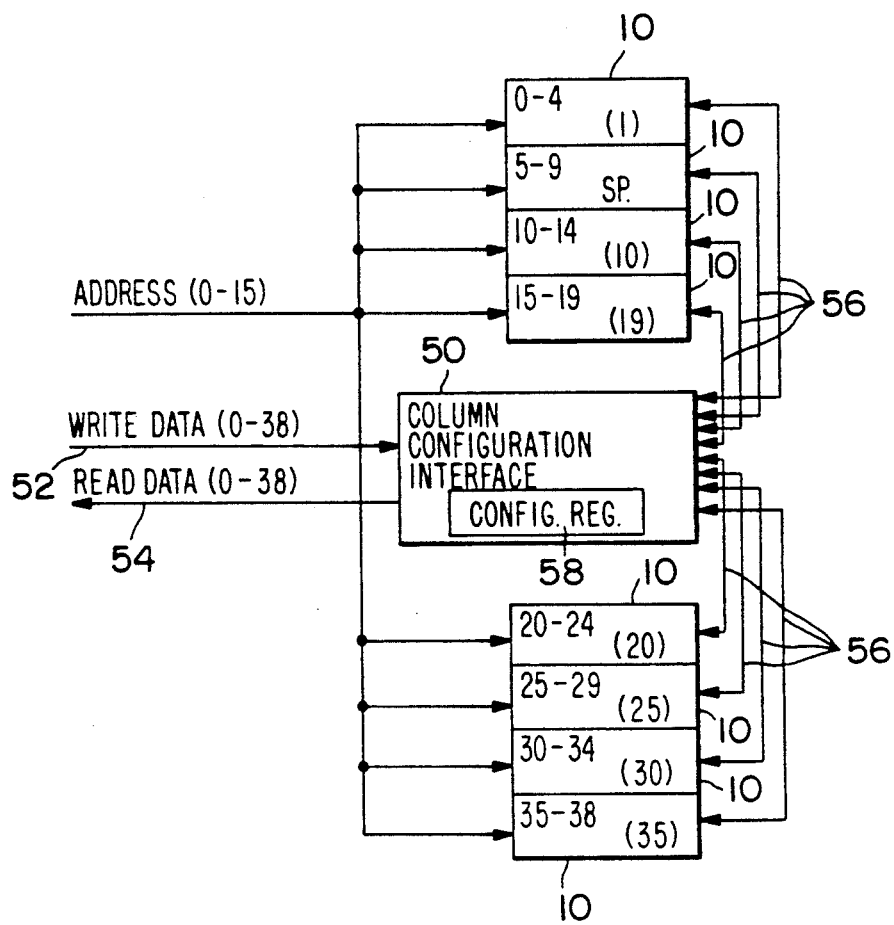
FIG. 4 is a simplified schematic view of one column of memory modules connected by a column configuration interface to a global data bus.

In a number of possible embodiments of a large memory of the type with which this invention is concerned, each memory module in a column of modules has its own data input and data output lines. One example of such an embodiment is the column configuration disclosed in application Ser. No. 07/498,882 filed Mar. 26, 1990, entitled "Memory Column Interface with Fault Tolerance," by Cameron Wade. FIG. 4 shows a single column of memory modules of the type disclosed in the aforementioned application. Each column of modules 10 has an associated column configuration interface 50. Write and read data buses 52, 54, of thirtynine bits each in the example, connect with the column configuration interface 50 and the separate bit positions of these data buses are connected to one-bit data input and output lines 56 between the column configuration interface 50 and the separate memory modules 10. Although the lines 56 are drawn as bidirectional lines, they must in fact include separate unidirectional lines for input and output. Bit assignments for the individual modules in the column are designated in a configuration register 58 within the column configuration interface 50. From the standpoint of this invention, what is important about FIG. 4 is that it shows a memory circuit configuration in which there is one input data line and one output data line for each of the memory modules in a single column.

Figure 5:
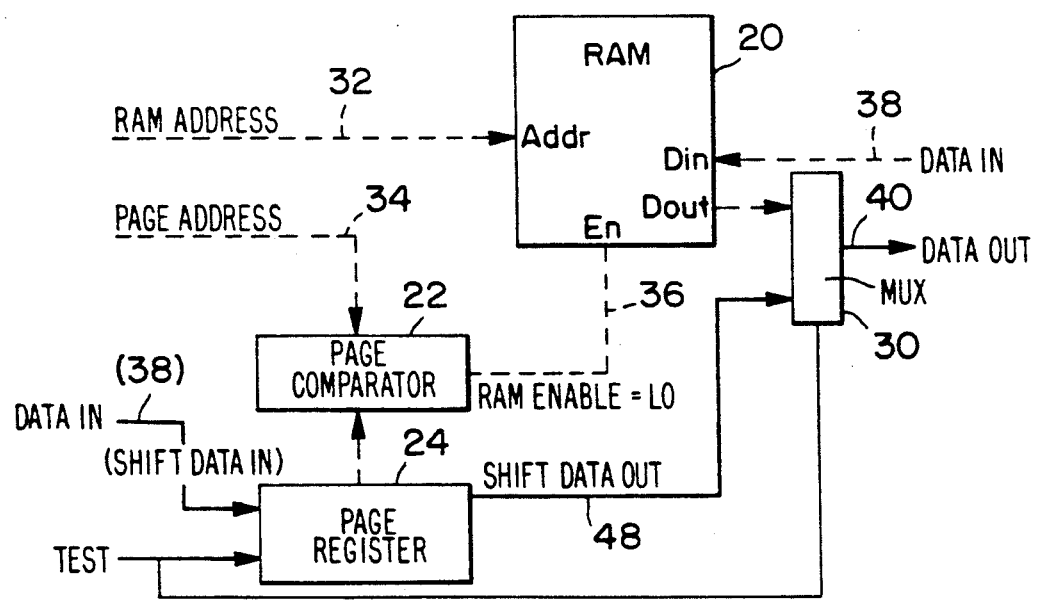
FIG. 5 is a block diagram of a memory module constructed in accordance with the invention.

In accordance with the present invention, the test address comparator is eliminated from the structure of FIGS. 2 and 3. FIG. 5 shows a memory module constructed in the manner of the invention, as used in the test mode. The RAM 20, page comparator 22, page register 24 and MUX 30 function in the operational mode in a similar fashion to their counterparts in FIG. 2. In the test mode, however, since there is no test address comparator the memory modules are not individually addressed through their hard-wired address. Moreover, the page address data signals are shifted in through data input line 38 instead of an address line. The data input line is, of course, not required for the input of RAM data in the test mode. Also, because there is one data input for each module in the column, separate serial page address data signals can be carried on these separate data lines, and an entire column of modules can have their page registers loaded with page address data simultaneously. Data signals shifted out of the page register are output over the data output lines in the same way as in FIG. 3. The time it takes to test a very large memory can therefore be reduced by a factor as large as N:1, where N is the number of modules in each column.

It will be appreciated from the foregoing that the present invention represents a significant advance in the field of very large reconfigurable memories. In particular, the invention provides for a reduction in the testing and configuration time in such a memory by addressing memory modules a column at a time in the test mode, instead of a module at a time. In addition, the improvement in testing time is effected by a reduction in the complexity of each memory module. It will also be appreciated that, although an embodiment of the invention has been described in detail for purposes of illustration, various modifications may be made without departing from the spirit and scope of the invention. Accordingly, the invention is not to be limited except as by the appended claims.

We claim:

1. A semiconductor memory module for use in a large reconfigurable memory, the memory module comprising:

a random access memory (RAM) having an enable terminal, RAM address terminals, a data input terminal and a data output terminal;

a two-to-one multiplexer having first and second inputs, the first input being connected to the data output terminal of the RAM, and having an output connected to supply output data from the memory module;

a page address register enabled only in a test mode to receive serial page address data over a data input line to the memory module and to simultaneously output serial data over an output line to the second input of the multiplexer; and a page address comparator used only in an operational mode to compare a page address stored in the page address register and a page address supplied over page address lines to the memory module, and to generate an enable signal to the RAM upon detection of a match;

wherein, in the test mode, page address data are shifted into the page address register from the data input line and simultaneously shifted out of the page address register, through the multiplexer and onto the data output line;

and wherein, in the operational mode, the RAM is enabled when the page address supplied on the address lines is the same as the page address stored in the page address register, and data may be written to the RAM from the data input line or read from the RAM onto the data output line.

2. A large reconfigurable memory, comprising:

a plurality of memory modules grouped into columns of modules, with each column having the same number of modules;

address bus means, for connecting to each module a logical address comprised of a page address and a random access memory (RAM) address;

data bus means, for connecting data to each bus, such that each module in a column has its own data input and output lines;

and wherein each memory module includes a random access memory (RAM) having an enable terminal, RAM address terminals, a data input terminal and a data output terminal, a two-to-one multiplexer having first and second inputs, the first input being connected to the data output terminal of the RAM, and having an output connected to supply output data from the memory module over its data output line, a page address register enabled only in a test mode to receive serial page address data over the data input line of the memory module and to simultaneously output serial data over an output line to the second input of the multiplexer, and a page address comparator used only in an operational mode to compare a page address stored in the page address register and a page address supplied over page the address lines to the memory module, and to generate an enable signal to the RAM upon detection of a match;

wherein, in the test mode, page address data are shifted into the page address register from the data input line of the module and simultaneously shifted out of the page address register, through the multiplexer and onto the data output line of the module;

and wherein, in the operational mode, the RAM is enabled when the page address supplied on the page address lines is the same as the page address stored in the page address register, and data may then be written into the RAM from the data input line or read from the RAM onto the data output line.

3. A method of using memory modules in a large reconfigurable memory, the method comprising the steps of:

applying a test mode signal to the modules when it is desired to load page address data into a page register in each module;

transmitting serial page address data through a data input line associated with a first of the modules;

shifting the page address data into a page register in the first module, and simultaneously shifting the previous contents of the page register out onto a data output line associated with the module; and simultaneously transmitting serial page address data through data input lines associated with others of the memory modules grouped in a single column with the first memory module, and shifting the page address data into the page registers of the other modules, while the previous contents of those page registers are shifted out onto the data output lines associated with the other memory modules; whereby and entire group of memory modules can be tested and configured simultaneously.

4. A method as defined in claim 3, and further including the steps of:

removing the test mode signal from the modules, to permit the modules to function in an operational mode;

comparing a page address stored in the page register with a page address applied to page address lines associated with modules and generating a match signal if the page addresses are the same;

enabling a random access memory (RAM) with the match signal;

writing data applied to the data input line of a module into the RAM, if enabled, at a location determined by a RAM address supplied to the module; and reading data onto the data output line of the module, from the RAM, if enabled, at a location determined by a RAM address supplied to the module.

* * * * *